United States Patent [19]
Weiss

[11] 3,952,142
[45] Apr. 20, 1976

[54] ELECTRONIC ENCLOSURE
[75] Inventor: Irving F. Weiss, University Heights, Ohio
[73] Assignee: Polycase, Inc., Cleveland, Ohio
[22] Filed: Aug. 9, 1974
[21] Appl. No.: 496,071

[52] U.S. Cl. .......................... 174/52 R; 174/52 PE
[51] Int. Cl.² .......................................... H05K 5/00
[58] Field of Search.................. 174/50, 52 R, 52 S, 174/52 PE; 317/101 DH, 101 D, 101 CB; 29/626, 627

[56] References Cited
UNITED STATES PATENTS

| | | | |
|---|---|---|---|
| 3,069,598 | 12/1962 | Daily et al. | 317/101 D |
| 3,377,515 | 4/1968 | Erb | 317/101 DH |
| 3,429,980 | 2/1969 | Guttmann | 174/52 S |
| 3,500,131 | 3/1970 | Seeley et al. | 174/52 R X |
| 3,829,604 | 8/1974 | Tanaka | 174/52 S |

Primary Examiner—Arthur T. Grimley
Assistant Examiner—David A. Tone
Attorney, Agent, or Firm—Watts, Hoffmann, Fisher & Heinke

[57] ABSTRACT

An all purpose electronic enclosure of electrically nonconductive material that adapts to various configurations and uses with a minimum of parts. A unitary receptacle portion has internal grooves to receive printed circuit boards, dividers and the like. One end of the receptacle portion is open. An optional cover closes the open end. Different cover constructions facilitate electrical connectors and mounting arrangements. External tracks on one or more sides of the enclosure receive plate-like members such as mounting plates, heat sinks, terminal block mountings and the like.

11 Claims, 18 Drawing Figures

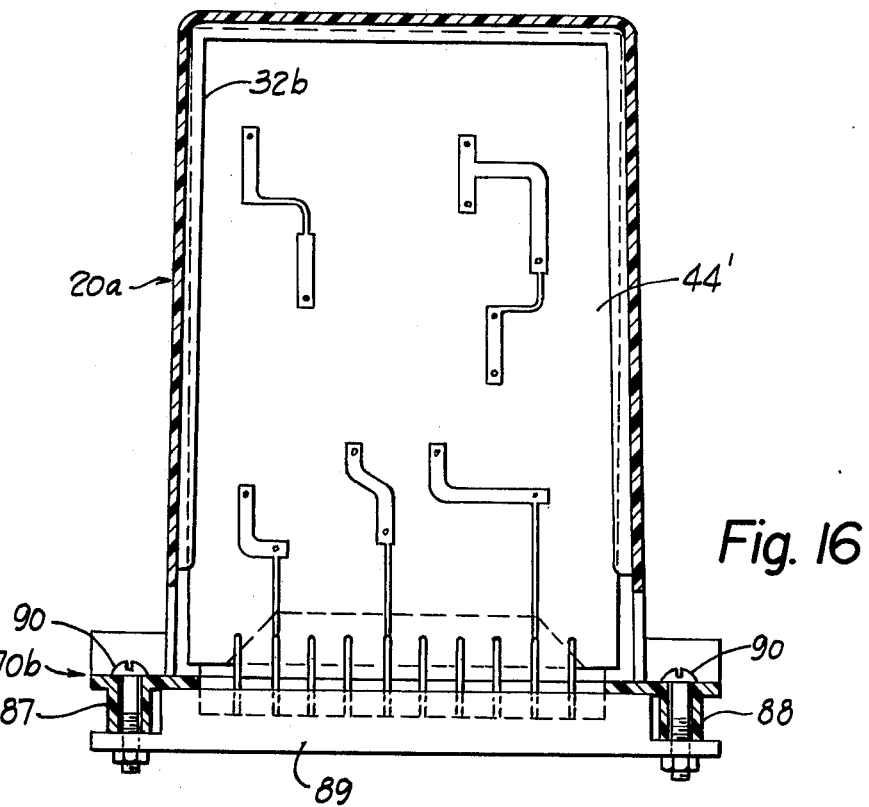
Fig. 16
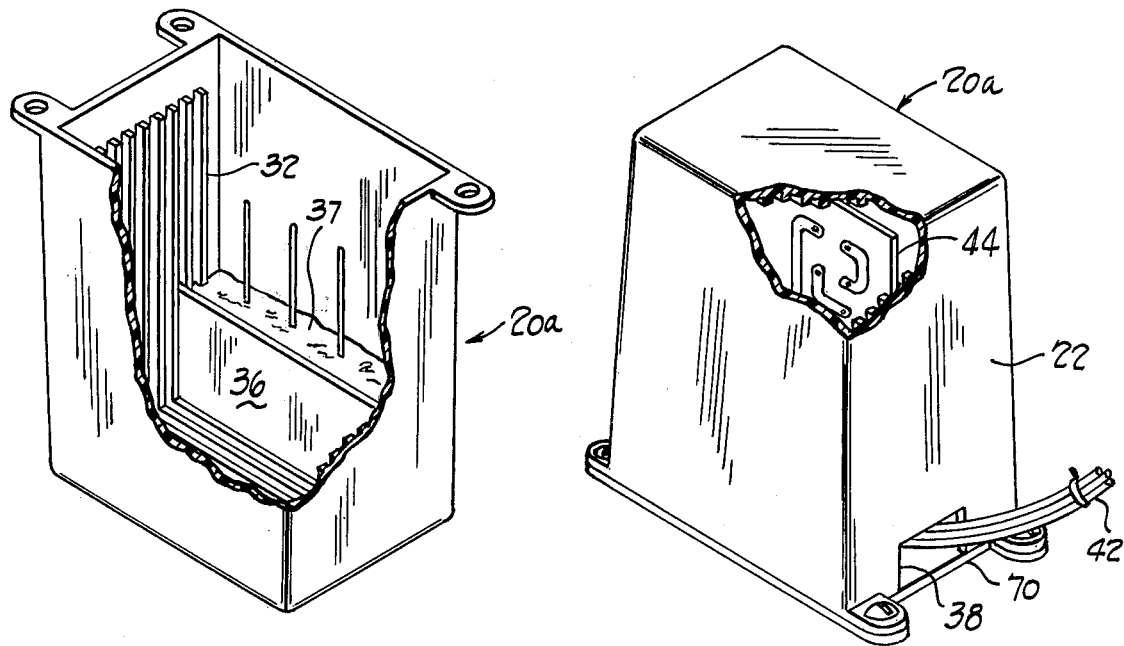
Fig. 18
Fig. 17

ELECTRONIC ENCLOSURE

BACKGROUND OF THE INVENTION

This invention relates to an enclosure for housing electronic components and the like.

Small printed circuit boards and associated components, as well as a variety of electrical and electronic devices with associated circuitry find wide use in many application, such as power supplies, control circuits of various types, alarm and indicator systems, and as components of larger circuits. In many of these uses, the circuits are individually designed and assembled or are made in quantities too small to justify a specially designed enclosure or chassis for housing the circuit. Frequently circuits are encapsulated in various "potting compounds" for the purpose of security from physical damage and for secrecy purposes. This has presented a troublesome "packaging" problem to the manufacturer. A definite need exists for a versatile, low cost, enclosure that would solve a great many encapsulating and mounting problems involving printed circuit board and electronic devices.

SUMMARY OF THE INVENTION

The present invention answers the above need through a novel enclosure construction that facilitates a variety of arrangements for encapsulating electronic components, for locating circuit boards and perforated boards on which electronic components can be mounted, and that facilitates a number of different arrangements for interfacing the components within the enclosure with power sources or circuits external to the enclosure.

Briefly, the enclosure of the present invention is comprised of a unitary structure with wall portions forming a receptacle with one open end and which optionally includes an end cover that can incorporate various features to facilitate mounting the enclosure or interfacing the contained circuits with external components of circuits. Parallel grooves are provided within the receptacle along two opposite side wall portions and preferably on a connecting end wall portion as well, for positioning and locating board-like members, such as printed circuit boards, perforated boards, partitions, and the like, within the receptacle. An opening is provided in one or more side wall portions at an edge defining the open end, to facilitate the passage of wires from the receptacle when a cover closes the open end. Lugs are provided adjacent the open end for securing a cover or for end-mounting the enclosure to equipment, a panel board, or other support.

In one embodiment of the enclosure, external tracks extend along the receptacle portion for receiving a strip or plate member, which can function as a heat sink for certain power components, a support bracket for the enclosure, or a mounting plate for terminal blocks or other elements. The tracks further serve to support a clip-on cover that will partially enclose any components supported by the tracks.

One embodiment of an end cover for the receptacle portion of the enclosure includes an elongated slot to facilitate the extension of a printed circuit board, such as a printed circuit board for use with an edge connector. Other embodiments of end covers facilitate attachment of sockets, pin connectors, or the like that can be wired within the enclosure to a printed circuit board or to particular electronic components and thereby interface the circuit or components with an external circuit. Thus a variety of electronic circuits and associated components can be assembled and housed within the enclosure, providing the necessary flexibility to solve the problem of convenient and inexpensive electronic packaging without custom design.

The enclosure is ideally molded of synthetic resin, such as polypropylene, which provides ruggedness, resistance to fire, moisture and chemicals, is readily moldable, has high dielectric strength, and is relatively low in cost. By molding the receptacle portion in the form of a unitary structure, the receptacle is liquid-proof, for facilitating the potting of components with an encapsulating compound. By inserting a divider in the internal grooves, the potting may be limited to a part of the space inside the receptacle. In this way a proprietary part or circuit can be encapsulated while leaving space for other parts to be added by the customer and permitting portions of the circuit to be repaired or replaced if necessary.

Because of the dielectric characteristic of the enclosure, different components can be conveniently insulated from one another. For example, if a power component is mounted to a metal heat sink, the metal can be used to support the component in the external tracks or internal grooves, without the need for insulators.

Where a printed circuit board is not practical, perforated boards can be wired and inserted into the internal grooves of the receptacle and, as with the printed circuit boards, a convenient electronic package results.

The above and other features and advantages of this invention will become more apparent from the detailed description that follows, when considered in connection with the accompanying drawings.

BRIEF DESCRIPTION OF THE DRAWINGS

FIG. 16 is a side view partially in section of the enclosure of FIG. 1 with the cover of FIG. 8, illustrating the manner in which the enclosure with an extending printed circuit board can be used with an edge connector receptacle;

FIG. 17 is a perspective view of the enclosure of FIG. 1 with the cover of FIG. 6, illustrating the manner in which electrical leads can extend from the covered receptacle; and FIG. 18 is a perspective view, partially broken away, of the enclosure of FIG. 1, illustrating a dividing plate that confines a potting compound to a part of the enclosure.

DESCRIPTION OF THE PREFERRED EMBODIMENTS

Figure 4:
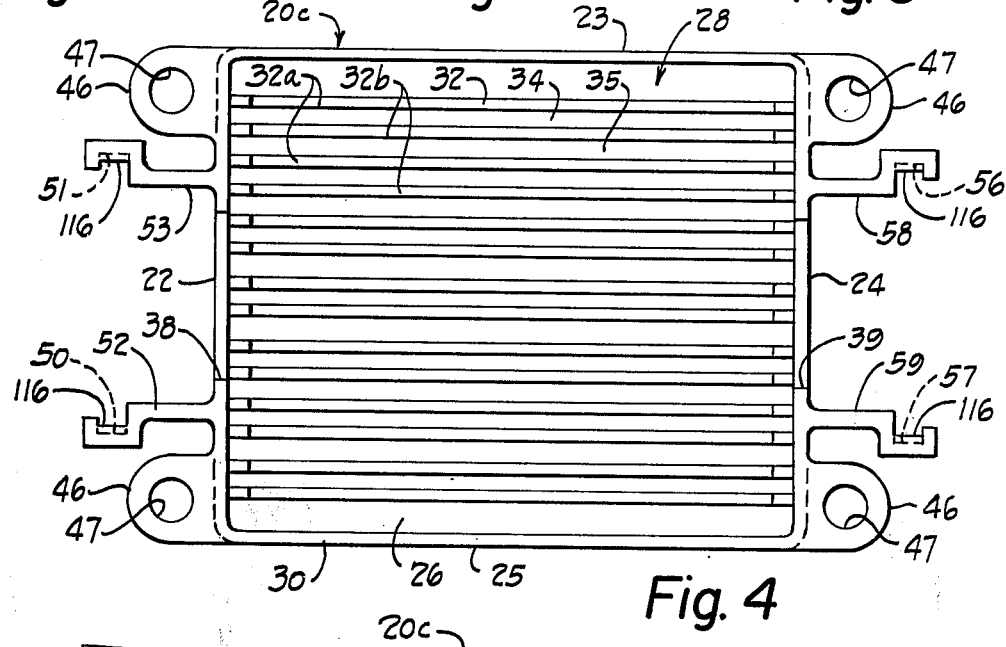
FIG. 4 is a bottom plan view of the enclosure of FIG. 3.
Figure 5:
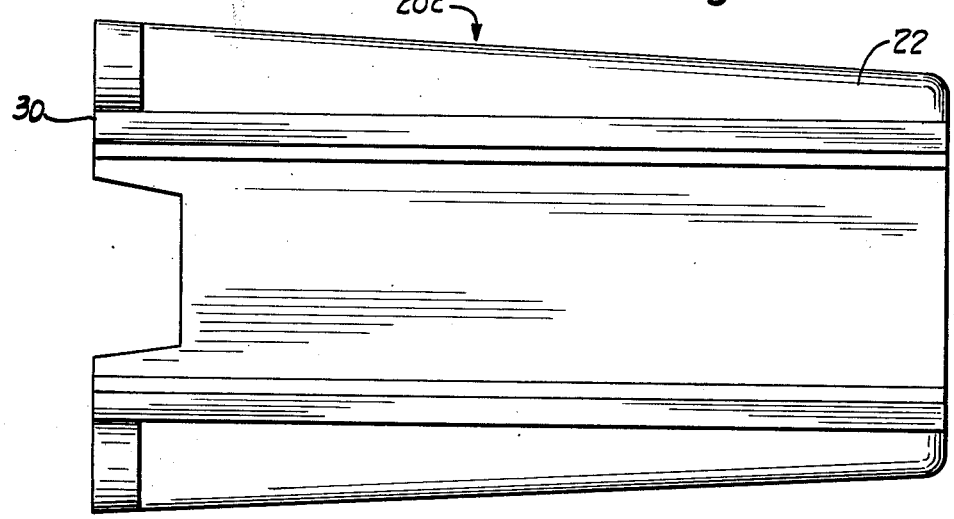
FIG. 5 is a side elevational view of the enclosure of FIG. 4.
Figure 6:
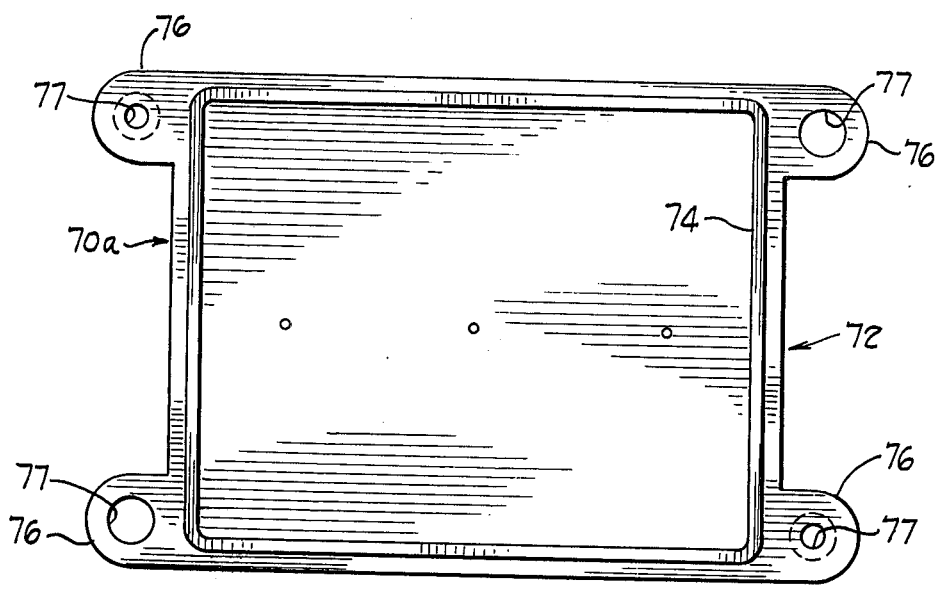
FIG. 6 is a plan view of one embodiment of a cover for the enclosures of FIGS. 1–3.
Figure 7:
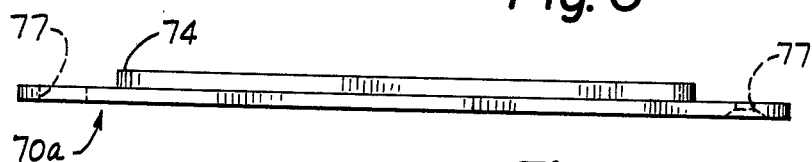
FIG. 7 is a side elevational view of the cover of FIG. 6.

Three preferred embodiments of an enclosure 20a, 20b, 20c embodying the present invention 1–3, respectively, of the drawings. The inside construction of the three embodiments of the enclosure is identical for each and is best shown in FIGS. 4 and 18 of the drawings. Common parts of the three embodiments will be indicated with the same reference numeral.

Referring to FIGS. 1–5, each enclosure 20a, 20b, 20c is of unitary construction, preferably molded of synthetic resin, such as polypropylene, and has a plurality of side wall portions 22, 23, 24, 25 and an end wall portion 26, all joined to form a liquid-proof receptacle portion 28 with an open side or end 30. The inside of the receptacle portion 28 has a plurality of spaced parallel ribs 32 on two opposite wall portions 22, 24 and across the end wall 26, that form grooves 34 and 35 of different size, to receive and locate printed circuit boards or the like. As best shown in FIG. 4, the ribs 32 are arranged in pairs 32a, 32b spaced apart approximately 1/16 of an inch to facilitate a standard circuit board thickness. Each pair is spaced from the next by slightly greater distance to accommodate heavier boards in the grooves 35. The walls 22, 24 are substantially parallel to each other and perpendicular to the end wall 26. The walls 23, 25 taper somewhat from the open end 30 toward the end wall portion 26.

In the preferred embodiments, the ribs 32 are continuous and are provided across the end wall 26. The portions across the end wall are especially advantageous for completing a peripheral seal, with a board or plate, such as the divider board 36 shown in FIG. 18, inserted into grooves 34 or 35 when a potting partition is used to confine an encapsulating compound 37 to a limited part of the enclosure, as illustrated in FIG. 18.

An opening 38 in the side wall portion 22 and an opening 39 in the side wall portion 24 permit wires to extend from components within the enclosure for connection with components or circuit elements outside of the enclosure, without interfering with the mounting of the enclosure to a surface flush against the open end 30 or with a cover 70, as shown in FIG. 17. As FIG. 17 illustrates, wires 42 connected within the enclosure 20a to a printed circuit board 44 extend through the opening 38 between the side wall 22 and the cover 70.

Four lugs 46 extend outwardly from the receptacle portion of the enclosure flush with the open side or end 30. Two of the lugs extend from the side wall 22 and the other two from the side wall 24, on opposite sides of the openings 38, 39. Each lug has an aperture 47 and facilitates fastening the enclosure to a panel board or the like, or facilitates attaching a cover 40 across the open end.

Figures 1, 2, 3:
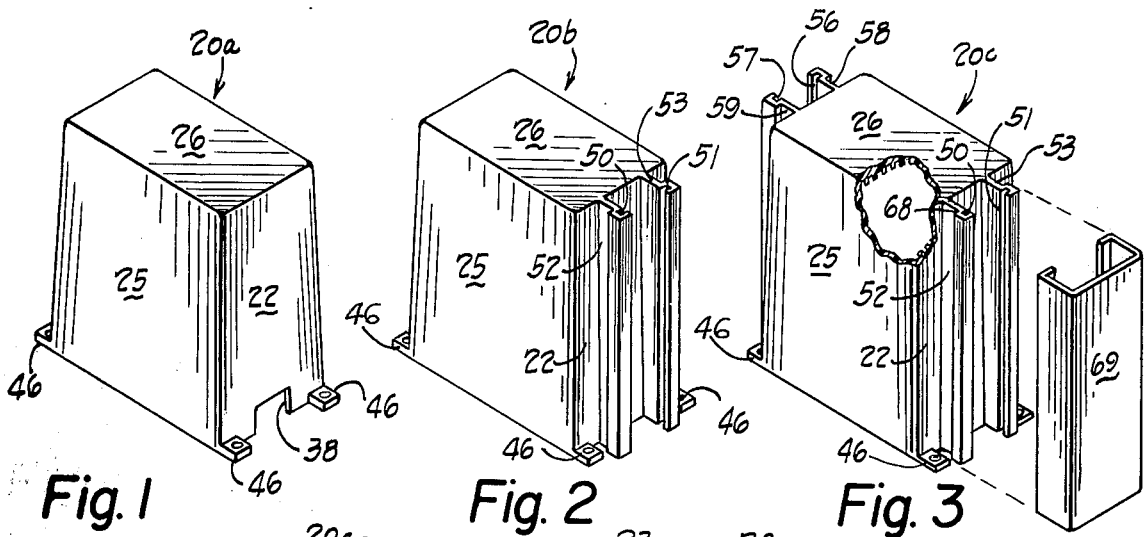
FIGS. 1–3 are perspective views of three embodiments of electronic enclosures typifying the invention.
Figures 10, 11, 14:
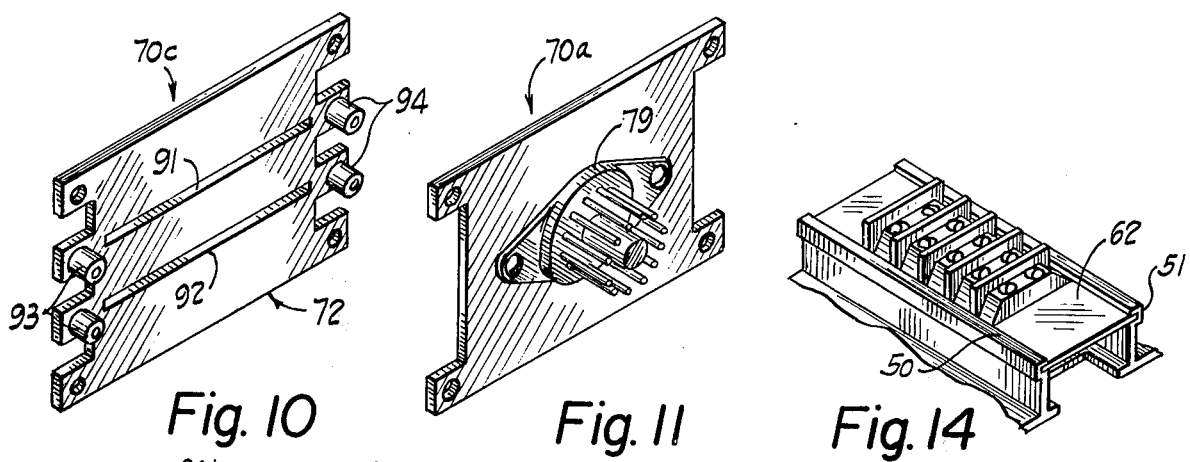
FIG. 10 is a perspective view of a third embodiment of a cover for the enclosures of FIGS. 1–3.
FIG. 11 is a perspective view of the cover of FIG. 6 with openings in which a pin connector is secured.
FIG. 14 is a fragmentary perspective view of the enclosure of FIGS. 2 or 3 showing the manner in which the strip and terminal block of FIG. 13 are carried.
Figure 15:
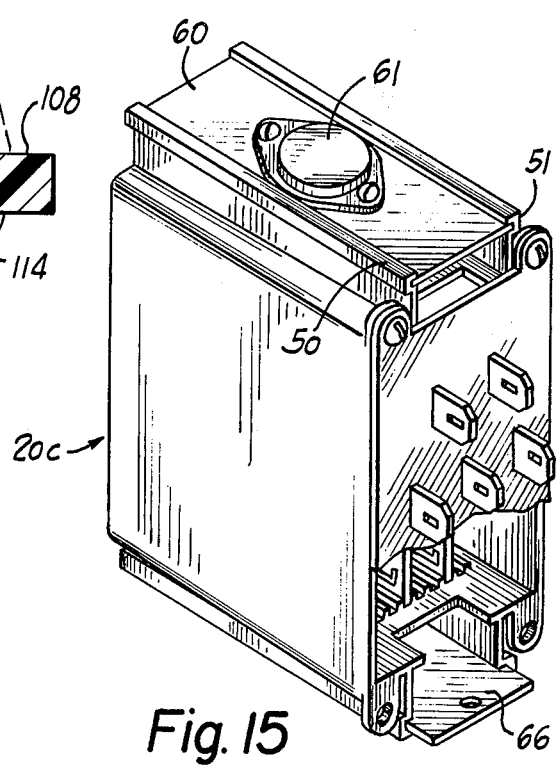
FIG. 15 is a perspective view of the enclosure of FIG. 3 illustrating the manner in which it can be used to house printed circuit boards and support an external mounting strip and heat sink and provide a plug-type cover.

External tracks 50, 51 are provided by projections 52, 53, respectively, integral with the receptacle portion 28, extending along the one side wall 22 in the embodiment 20b of FIG. 2. Additional external tracks 56, 57 provided by integral projections 58, 59 extend along the opposite side wall 24, as well, in the enclosure 20c of FIG. 3. The tracks are in the form of parallel grooves facing one another in a common plane and serve to receive flat elements, such as a metal strip 60 that can serve as a heat sink for a power semi-conductor 61, as shown in FIG. 15, or a mounting strip 62 for a terminal block 64 as illustrated in FIG. 14, or for a plate 66, as also illustrated in FIG. 15, for mounting the enclosure on a support. Each integral projection and external track is shaped to provide an external flange or lip 68, as indicated in FIG. 3, to secure a channel-shaped cover 69, to partially enclose eomponents on a strip held by the tracks.

Three embodiments of covers 70a, 70b, 70c are shown in FIGS. 6 and 7, FIGS. 8 and 9, and FIG. 10, respectively. These covers are the same, except for various openings, and similar parts will be designated by the same reference numeral.

Each cover 70a, 70b, 70c includes a flat rectangular plate portion 72 with an inset peripheral rim 74 on one side of the plate portion and adapted to face inwardly of the receptacle portion of the enclosure and be received within the open end 30, in engagement with the inside perimeter of the open end that is formed by the ends of the wall portions 22–25. Four ears 76 with apertures 77 extend from the narrow sides of the cover in a position to overlie the four lugs 46 when the cover is placed over the open end 30. The cover can be attached to the receptacle by fasteners through the apertures 77 and 47, to close the receptacle. In the case of the cover 70a, a central portion can be punched to produce an opening that will receive a socket or plug, such as the pin plug 79 shown in FIG. 11 to provide an electrical interface. The pin plug can then be connected within the receptacle portion 28 to circuit components and will adapt the enclosure to be plugged into a receptacle.

Figure 8:
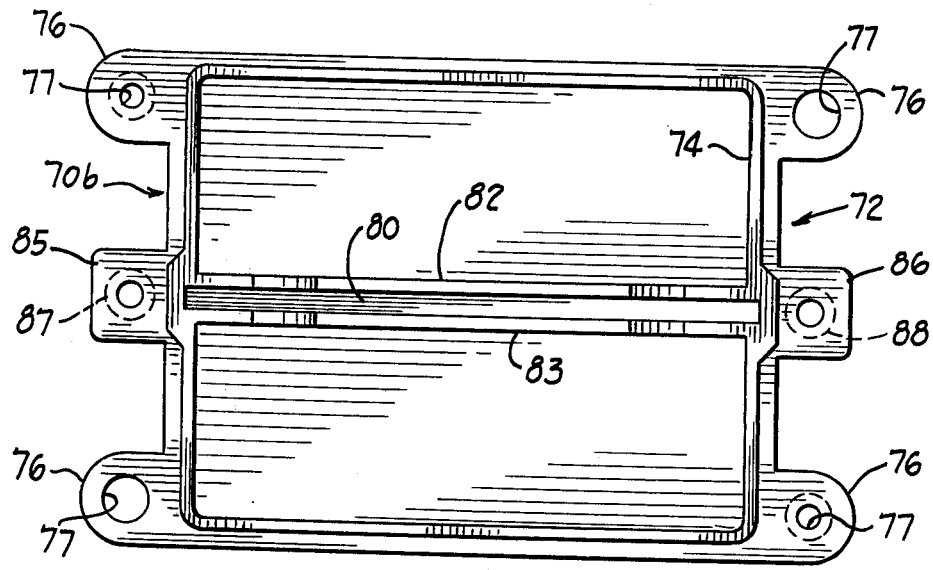
FIG. 8 is a plan view of a second embodiment of a cover for the enclosures of FIGS. 1–3.
Figure 9:
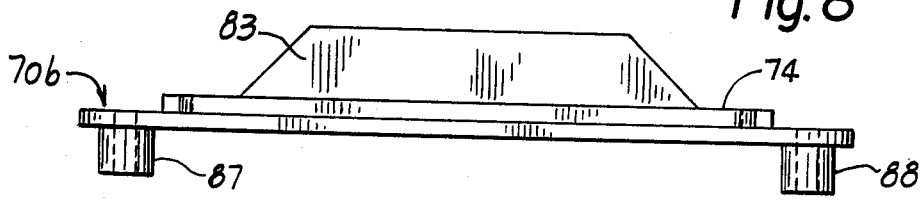
FIG. 9 is a side elevational view of the cover of FIG. 8.

The cover 70b shown in FIGS. 8 and 9 is the same as cover 70a except for (a) a central slot 80 extending the long dimension of the cover a distance equal to the full width of the inside of the receptacle portion with which the cover is used, (b) flanges 82, 83 extending from the flat plate portion 72 in the same direction as the rim 74, along opposite longitudinal edges of the slot 80, and (c) side tabs 85, 86 with annular spacer studs 87, 88, respectively, each located at the ends of and aligned with the slot 80. The studs face outwardly, in an opposite direction from the flanges 82, 83.

The flanges 82, 83 extend from the flat plate portion 72 a distance greater than the width of the slot and may diverge slightly from the slot to aid in receiving the end of a printed circuit board or the like, adapted to extend through the slot. The substantial distance that the flanges extend from the flat plate portion facilitates drilling and inserting a fastener, if it is desired to secure the cover directly to a printed circuit board, perforated board, or the like extending through the slot. The flanges do not extend at full depth the entire width of the slot, but rather taper down to the height of the rim 74 short of each opposite end, permitting a board to be first inserted between flanges without regard to its lengthwise alignment with the confines of the slot.

The central slot 80 is slightly wider than the grooves 34 when the cover is in place over the open end 30, with the rim 74 inside the opening of the receptacle portion. This permits a printed circuit board 44' positioned by the ribs 32a, 32b to extend from the enclosure through the slot 80, as best shown in FIG. 16. The extending portion of the printed circuit board can provide an edge connection with a suitable socket 89, as shown in FIG. 16.

The spacer studs 87, 88 are spaced apart a distance and extend from the plate portion 72 distances suitable to accommodate the shape of a standard edge connection socket and to receive fasteners 90 that extend through the socket to secure the enclosure to the socket and socket support base. See FIG. 16. An enclosure with an affixed cover 70b and an extending printed circuit board can be quickly and easily inserted into an edge connection socket and if desired can be securely fastened to the socket and base.

The cover 70c in FIG. 10 is the same as the cover 70b, except that two slots 91, 92 are provided, spaced for alignment with two grooves 34 of the receptacle portion and providing flanges (not shown) and spacer studs 93, 94 the same as those associated with the slot 80, to facilitate two printed circuit boards extending from the enclosure, to be received in two edge connection sockets. It will be apparent that additional slots and spacer studs could be provided if more than two slots are desired.

Figure 12:
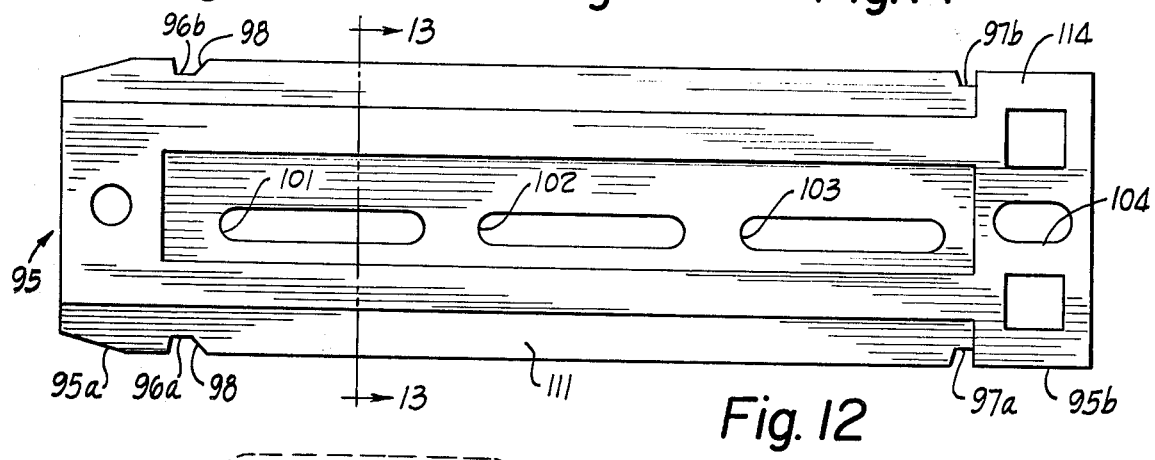
FIG. 12 is a bottom plan view of a mounting strip or plate for use with the enclosures of FIGS. 2 and 3.

A strip member 95 (FIGS. 12 and 13) is constructed to form a combination mounting bracket and terminal block mount. The strip member is used in combination with an enclosure in the same manner as are the strips 60, 62 and 66 of FIGS. 14 and 15. The member is rectangular in shape and is constructed preferably of synthetic resin to provide dielectric characteristics. One end portion 95a is tapered and the opposite end portion 95b is straight. One pair of oppositely disposed side notches 96a, 96b is adjacent the tapered end 95a and a second pair of notches 97a, 97b is adjacent the straight end 95b. The notches 96a, 96b have an inclined surface 98, sloped outwardly and away from the tapered end 95a. These notches 96, 97 serve to locate the strip member in the tracks 50, 51 or 56, 57 in a manner to be described.

A row of apertures 100, 101, 102, 103 and 104 is provided centrally along the length of the strip member. The two end apertures 100, 104 serve to receive mounting screws while the three apertures 101, 102, 103 between the mounting apertures are elongated lengthwise of the strip and serve to receive terminal ends.

The strip has a flat top surface 108 with an elongated recess 109 in which numbers or other indicia are formed, in this case to indicate the terminal positions. The recess is capable of receiving a covering strip in the event other indicia is desired. A bottom surface 111 of the strip has two elongated parallel ridges 112, 113 (FIG. 13) which act as stops for nuts of fasteners, as indicated in phantom. In addition, a part 114 of the straight end portion 95b has a greater thickness than the remainder of the strip, except for the ridges 112, 113. This thicker part acts as a stop in addition to the notches, to help locate the strip within the tracks.

The tracks for receiving the strip have projections 116 at each opposite end. See FIG. 4. The resilience of the material forming the tracks and the mounting projections for the tracks allows the tracks to be spread apart by the inclined sides of the tapered end 95a as the strip is slid tapered end first through the tracks. The projections then locate the strip member by snapping into the notches 96a 96b and 97a, 97b. The tapered portion 98 of the notches 96 permit the first notches to be pushed past the pair of projections at the entry end of the tracks. It will be understood that the ends of the strip 95 beyond the notches, extend beyond opposite ends of the tracks, similar to the strip 66 in FIG. 15.

Figure 13:
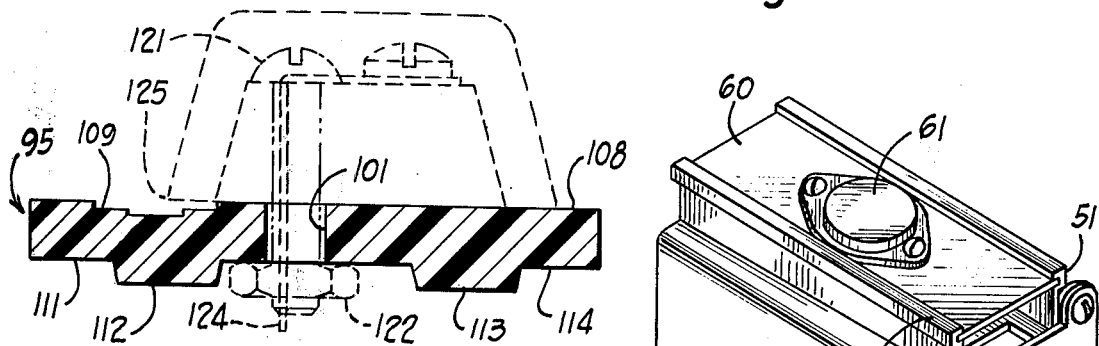
FIG. 13 is a cross-sectional view of the mounting strip of FIG. 12 taken along the line 13—13 showing in phantom a terminal block mounted to the strip.

The manner in which a terminal block 120 attaches to the strip 95 is shown in phantom in FIG. 13. The terminal block rests against the top surface 108. The end apertures 100 and 104 receive mounting screws 121. The bottom ridge 112 of the strip acts as a stop against the mounting nuts 122 to prevent rotation of the nuts during attachment of the block. The elongated apertures 101, 102, 103 receive pass-through leads 124 of the terminal block 120. An edge 125 of the terminal block overlies the elongated recess 109 on the top surface, to retain an indicia strip, if designations different from those in the recess are desired.

It will be apparent from the above description of various embodiments of this invention that an enclosure has been provided that will house a plurality of printed circuit boards or perforated boards carrying electronic components and will readily facilitate the interfacing of such components with external circuitry, including standard sockets and plugs. The enclosure has the adaptability for housing a variety of electronic components apart from board mounted components, and is particularly suitable for encapsulation of the components within the enclosure. With the external tracks, the enclosure can support terminal blocks, power semi-conductors, and the like which are most effectively located outside of the enclosure and separate from the board mounted or potted components to facilitate interconnection, heat dissipation, replacement, and the like.

While various embodiments of this invention have been disclosed in detail, it will be apparent that modifications or alterations may be made therein, without departing from the spirit and scope of the invention set forth in the appended claims.

What is claimed is:
1. An insulating enclosure for electronic components and the like, comprising:
   an electrically nonconductive, unitary, structure having four side walls and one end wall joined in box-like relationship to form a liquid-proof receptacle with an open end,
   A plurality of continuous guide surfaces extending along two opposite side walls and the end wall, substantially parallel to the other two side walls, for receiving edge portions of a thin, flat, board or plate and for spacing the board or plate from said other two side walls,
   a cover removably fastened to said structure over the open end with at least one slot in the cover extending between said two opposite side walls and through which a portion of said board or plate can extend, said cover having two flanges along opposite sides of said slot extending into the receptacle a distance greater than the width of the slot.
2. An enclosure as set forth in claim 1 wherein said cover has two studs at opposite ends of the slot extending in a direction opposite from said flanges and for a distance greater than the width of the slot.

3. An insulating enclosure for electronic components and the like, comprising:
an electrically nonconductive, unitary, structure having four side walls and one end wall joined in box-like relationship to form a liquid-proof receptacle with an open end,
a plurality of continuous guide surfaces extending along two opposite side walls and the end wall, substantially parallel to the other two side walls, for receiving edge portions of a thin, flat, board of plate and for spacing the board or plate from said other two side walls, and
two spaced parallel projections on one side wall externally of the receptacle, each having a groove parallel to and facing the other for slidably receiving and retaining a plate-like member relative to and externally of the receptacle formed by said structure.

4. An enclosure as set forth in claim 3 including a plate-like member in said grooves.

5. An enclosure as set forth in claim 4 wherein said plate-like member includes apertures and a terminal block secured to the member with feed-through leads extending through the apertures.

6. An enclosure as set forth in claim 3 including a transverse obstruction adjacent one end of each groove to restrain sliding movement of a received plate.

7. An enclosure as set forth in claim 3 wherein said projections are each elongated parallel to the grooves along substantially the length of said one side wall and include an outwardly facing lip for retaining a cover.

8. An enclosure as set forth in claim 7 including a channel-shaped cover engaging each said outwardly facing lip and extending across said projections.

9. An enclosure as set forth in claim 3 including an additional two spaced parallel projections with facing grooves carried from a second side wall opposed to said one side wall and externally of said receptacle for slidably receiving and retaining a plate-like member relative to said structure.

10. An insulating enclosure for electronic components and the like, comprising:
an electrically nonconductive, unitary, structure having four side walls and one end wall joined in box-like relationship to form a liquid-proof receptacle with an open end,
a plurality of continuous guide surfaces extending along two opposite side walls and the end wall, substantially parallel to the other two side walls, for receiving edge portions of a thin, flat, board or plate and for spacing the board or plate from said other two side walls, and
an opening at the edge of one side wall at the open end of the receptacle through which wires or the like may pass.

11. An enclosure as set forth in claim 10 including four external apertured lugs extending outwardly from walls of said structure which facilitate mounting the structure to a support or securing a cover to the structure.

* * * * *